United States Patent
Ishikawa et al.

(10) Patent No.: US 10,262,711 B2
(45) Date of Patent: Apr. 16, 2019

(54) MAGNETIC MEMORY

(71) Applicant: KABUSHIKI KAISHA TOSHIBA, Minato-ku (JP)

(72) Inventors: Mizue Ishikawa, Yokohama Kanagawa (JP); Yushi Kato, Chofu Tokyo (JP); Yoshiaki Saito, Kawasaki Kanagawa (JP); Soichi Oikawa, Hachioji Tokyo (JP); Hiroaki Yoda, Kawasaki Kanagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/691,991

(22) Filed: Aug. 31, 2017

(65) Prior Publication Data

US 2018/0268886 A1  Sep. 20, 2018

(30) Foreign Application Priority Data

Mar. 17, 2017  (JP) .................................. 2017-053567

(51) Int. Cl.
*G11C 11/16* (2006.01)
*G11C 5/08* (2006.01)
(Continued)

(52) U.S. Cl.
CPC .............. *G11C 11/161* (2013.01); *G11C 5/08* (2013.01); *G11C 11/18* (2013.01); *H01L 27/226* (2013.01); *H01L 43/04* (2013.01); *H01L 43/10* (2013.01)

(58) Field of Classification Search
CPC ......... G11C 11/161; G11C 5/08; G11C 11/18; H01L 27/226; H01L 43/04; H01L 43/10
(Continued)

(56) References Cited

U.S. PATENT DOCUMENTS 9,076,357 B2   7/2015   Hussain et al.
9,076,541 B2   7/2015   Ong et al.
(Continued)

FOREIGN PATENT DOCUMENTS

JP   2014-45196 A    3/2014
JP   2014-179618 A   9/2014
(Continued)

OTHER PUBLICATIONS

Wang, Phys Rev Lett. May 16, 2014;112(19):197201. Epub May 15, 2014.*
(Continued)

*Primary Examiner* — Xiaochun L Chen
(74) *Attorney, Agent, or Firm* — Oblon, McClelland, Maier & Neustadt, L.L.P.

(57) ABSTRACT

A magnetic memory of an embodiment includes: first through third terminals; a conductive layer including first through third portions, the first portion being located between the second and third portions, the second and third portions being electrically connected to the first and second terminals respectively; and a magnetoresistive element including: a first magnetic layer electrically connected to the third terminal; a second magnetic layer disposed between the first magnetic layer and the first portion; a first nonmagnetic layer disposed between the first magnetic layer and the second magnetic layer; a third magnetic layer disposed between the first nonmagnetic layer and the second magnetic layer; and a second nonmagnetic layer disposed between the second magnetic layer and the third magnetic layer, a sign of a spin Hall angle of the second nonmagnetic layer being different from a sign of a spin Hall angle of the conductive layer.

20 Claims, 9 Drawing Sheets (51) Int. Cl.
  *H01L 27/22* (2006.01)
  *G11C 11/18* (2006.01)
  *H01L 43/04* (2006.01)
  *H01L 43/10* (2006.01)

(58) Field of Classification Search
  USPC .......................................................... 365/66
  See application file for complete search history.

(56) References Cited

U.S. PATENT DOCUMENTS

| | | | |
|---|---|---|---|
| 9,300,301 | B2 | 3/2016 | Bromberg et al. |
| 9,691,458 | B2* | 6/2017 | Ralph ..................... G11C 11/18 |
| 2012/0063201 | A1* | 3/2012 | Hayakawa ......... G11C 13/0007 |
| | | | 365/148 |
| 2014/0063936 | A1* | 3/2014 | Shim ................. H01L 27/11582 |
| | | | 365/184 |
| 2014/0169088 | A1* | 6/2014 | Buhrman ................ G11C 11/18 |
| | | | 365/158 |
| 2014/0269035 | A1* | 9/2014 | Manipatruni ....... G11C 11/1675 |
| | | | 365/158 |
| 2016/0225424 | A1* | 8/2016 | Qiu ....................... H01F 10/329 |
| 2016/0276006 | A1* | 9/2016 | Ralph ..................... G11C 11/18 |
| 2016/0300999 | A1 | 10/2016 | Yi et al. |
| 2017/0077177 | A1* | 3/2017 | Shimomura .......... H01L 27/228 |
| 2018/0040357 | A1 | 2/2018 | Shirotori et al. |

FOREIGN PATENT DOCUMENTS

| | | |
|---|---|---|
| JP | 2018-22806 A | 2/2018 |
| WO | WO 2016/159017 A1 | 10/2016 |

OTHER PUBLICATIONS

Jiawei Yu, et al., "Large spin-orbit torques in Pt/Co—Ni/W heterostructures", Applied Physics Letters, vol. 109 No. 4, 2016, pp. 042403-1-042403-5 with cover pages.

Jairo Sinova, et al., "Spin Hall Effects", Reviews of Modern Physics, vol. 87 No. 4, Oct.-Dec. 2015, pp. 1213-1259.

S.S.P. Parkin, "Systematic Variation of the Strength and Oscillation Period of Indirect Magnetic Exchange Coupling through the 3d, 4d, and 5d Transition Metals", Physical Review Letters, vol. 67 No. 25, Dec. 16, 1991, pp. 3598-3601.

U.S. Appl. No. 15/499,040, filed Mar. 3, 2017, Satoshi Shirotori, et al.

Hochul Lee, et al., "Low-Power, High-Density Spintronic Programmable Logic With Voltage-Gated Spin Hall Effect in Magnetic Tunnel Junctions", IEEE Magnetics Letters, vol. 7, Mar. 4, 2016, 5 Pages.

* cited by examiner

| SOT CANDIDATE | $\Theta_{SH}$(R.T.) | RESISTIVITY ($\times 10^{-7}$ $\Omega$m) | SPECIFIC RESISTANCE WITH RESPECT TO Fe | COUPLING |
|---|---|---|---|---|
| W | -0.14 | 0.528 | 0.5 | ANTIFERROMAGNETIC |
| Ta | -0.12 | 1.31 | 1.3 | ANTIFERROMAGNETIC |
| Hf | -0.11 | 3.31 | 3.3 | No data |
| Re | -0.04 | 10.2 | 10.2 | ANTIFERROMAGNETIC |
| Pt | 0.11 | 1.06 | 1.1 | FERROMAGNETIC |
| Pd | 0.01 | 1.5 | 1.1 | FERROMAGNETIC |
| Ag | 0.007 | 0.159 | 0.2 | FERROMAGNETIC |
| Au | 0.084 | 0.221 | 0.2 | FERROMAGNETIC |
| Cu | 0.003 | 0.168 | 0.2 | ANTIFERROMAGNETIC |
| $Au_{0.93}W_{0.07}$ | 0.1 | 5.70 | 5.7 | No data |
| $Cu_{0.997}Bi_{0.3}$ | -0.26  0.081 | ~0.5 | 0.5 | ANTIFERROMAGNETIC |

MAGNETIC MEMORY

CROSS-REFERENCE TO RELATED APPLICATIONS

This application is based upon and claims the benefit of priority from Japanese Patent Application No. 2017-053567, filed on Mar. 17, 2017, the entire contents of which are incorporated herein by reference.

FIELD

Embodiments described herein relate generally to magnetic memories.

BACKGROUND

Magnetic memory devices (magnetic random access memory (MRAM)) including tunneling magnetoresistance effect (TMR) elements as memory elements are now drawing attention as one kind of next-generation nonvolatile memory.

In recent years, practical use of STT (Spin Transfer Torque)-MRAM of a current-driven type has been expected. However, as miniaturization has progressed in the course of increasing capacities, device characteristic variation has become wider, and it is now difficult to maintain the read current, the write current, the transistor current, and a margin between breakdown currents of MTJ elements by reducing variation of each of the currents.

In view of this, an SOT-MRAM utilizing spin orbit interactions (spin orbit torque (SOT)) has been suggested. In the SOT-MRAM, an MTJ element is placed on a nonmagnetic layer (also called an SO layer), and a write current is applied to the nonmagnetic layer, so that the magnetization of the storage layer in the MTJ element is switched. Reading is performed by applying a read current between the nonmagnetic layer and the reference layer of the MTJ element. Accordingly, in the SOT-MRAM, the write current path and the read current path can be separated from each other, and the breakdown current of the MTJ element can be lowered. Thus, the limit on the margin of variation due to miniaturization can be reduced.

However, according to the studies made so far, a nonmagnetic layer having an SOT effect is joined directly to the lower portion of a storage layer. A magnetization switching in the storage layer is caused by the nonmagnetic layer (hereinafter also referred to as the SO layer) placed below the storage layer. Therefore, a nonmagnetic material having a large spin Hall angle is preferably used as the SO layer so as to reduce the reversing current.

Also, as an SOT-MRAM becomes smaller, the influence of field leakage into memory elements of other memory cells becomes larger.

Meanwhile, a structure in which a magnetic layer is interposed between two nonmagnetic layers having spin Hall angles with different signs from each other has also been suggested. There is a report that, with this structure, spin injection into the magnetic layer can be conducted with higher efficiency, and the magnetization of the magnetic layer can be effectively switched. However, there have been neither disclosures nor suggestions of the use of this structure in a magnetic memory.

DETAILED DESCRIPTION

Before embodiments of the present invention are described, the course of events before the present inventors achieved the present invention will be described below.

In a conventional SOT-MRAM, a magnetization swithching in the storage layer is caused by an SO layer placed below the storage layer. Therefore, to reduce the switching current, a nonmagnetic material having a large spin Hall angle is used. In a case where a stack structure in which a magnetic layer is interposed between two nonmagnetic layers having spin Hall angles with different signs from each other is used as an SOT-MRAM, the switching current can be reduced. However, a current needs to be applied to the stack structure formed with a first nonmagnetic layer, a magnetic layer, and a second nonmagnetic layer. Moreover, to use the stack structure formed with the first nonmagnetic layer, the magnetic layer and the second nonmagnetic layer as the storage layer, the plane of the magnetic layer is preferably located on the surface of the SO layer, and a suitable structure needs to be devised.

In view of this, the inventors assumed that, with an SOT-MRAM that uses a stack structure formed with a first magnetic layer interposed between first and second nonmagnetic layer having spin Hall angles with different signs from each other, and a second magnetic layer, the current for switching the magnetization of the storage layer can be reduced, and the influence of field leakage can also be reduced. In the description below, magnetic memories each having such a structure will be described as embodiments.

The following is a description of embodiments of the present invention, with reference to the accompanying drawings. The drawings are schematic, and the relationship between the thickness and the width of each component, and the size ratios between the components are not necessarily true to reality. Even the same component shown in two or more drawings might vary in size or ratio depending on the drawings.

A magnetic memory according to an embodiment includes: first through third terminals; a conductive layer including first through third portions, the conductive layer being nonmagnetic, the first portion being located between the second portion and the third portion, the second portion being electrically connected to the first terminal, the third portion being electrically connected to the second terminal; and a magnetoresistive element including: a first magnetic layer electrically connected to the third terminal; a second magnetic layer disposed between the first magnetic layer and the first portion; a first nonmagnetic layer disposed between the first magnetic layer and the second magnetic layer; a third magnetic layer disposed between the first nonmagnetic layer and the second magnetic layer; and a second nonmagnetic layer disposed between the second magnetic layer and the third magnetic layer, a sign of a spin Hall angle of the second nonmagnetic layer being different from a sign of a spin Hall angle of the conductive layer.

(First Embodiment)

Figure 1:
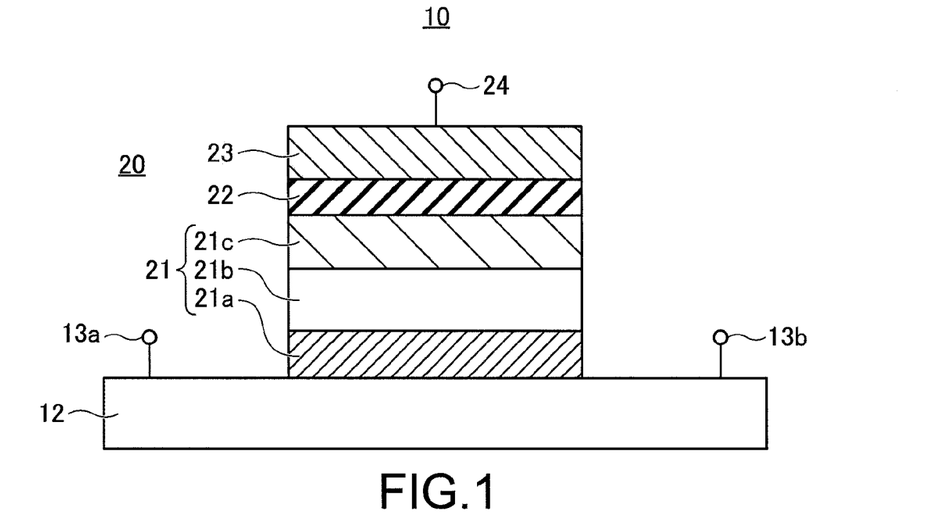
FIG. 1 is a cross-sectional view of a magnetic memory according to a first embodiment.

Referring now to FIG. 1, a magnetic memory according to a first embodiment is described.

The magnetic memory of the first embodiment includes at least one memory cell 10. Each memory cell 10 includes a conductive nonmagnetic layer 12 (also referred to as the conductive layer 12) and a magnetoresistive element 20 disposed on the nonmagnetic layer 12. The nonmagnetic layer 12 includes first through third portions, and the first portion is located between the second portion and the third portion.

The magnetoresistive element 20 includes a storage layer 21, a nonmagnetic layer 22, and a reference layer 23 that are arranged in this order on the first portion of the nonmagnetic layer 12. That is, the storage layer 21 is disposed between the first portion of the nonmagnetic layer 12 and the reference layer 23, and the nonmagnetic layer 22 is disposed between the storage layer 21 and the reference layer 23. The reference layer 23 includes a magnetic layer (first magnetic layer) having a fixed magnetization direction, and the storage layer 21 includes a magnetic layer (second magnetic layer) having a changeable magnetization direction. Here, "a fixed magnetization direction" means that the magnetization direction does not change before and after a write operation, and "a changeable magnetization direction" means that the magnetization direction can change before and after a write operation. The magnetoresistive element 20 is an MTJ element in a case where the nonmagnetic layer 22 is an insulative nonmagnetic layer, but is a GMR (Giant MagnetoResistive) element in a case where the nonmagnetic layer 22 is a conductive nonmagnetic layer. In the description below, the magnetoresistive element 20 is an MTJ element.

In the MTJ element 20, the storage layer 21 has a structure in which a magnetic layer (second magnetic layer) 21a, a nonmagnetic layer 21b, and a magnetic layer (third magnetic layer) 21c are stacked in this order. That is, the magnetic layer 21a is disposed between the first portion of the nonmagnetic layer 12 and the nonmagnetic layer 22, the nonmagnetic layer 21b is disposed between the magnetic layer 21a and the nonmagnetic layer 22, and the magnetic layer 21c is disposed between the nonmagnetic layer 21b and the nonmagnetic layer 22. The magnetic layer 21a and the magnetic layer 21c are antiferromagnetically or ferromagnetically exchange-coupled to each other via the nonmagnetic layer 21b. However, antiferromagnetic exchange coupling can reduce the influence of electric field leakage into adjacent memory cells, and therefore, is preferable. As the magnetic layer 21a and the magnetic layer 21c are exchange-coupled to each other, the magnetization direction of one of the magnetic layers 21a and 21c is switched when the magnetization direction of the other one of the magnetic layers 21a and 21c is switched due to writing.

Terminals 13a and 13b are electrically connected to the nonmagnetic layer 12, and a terminal 24 is electrically connected to the reference layer 23. It should be noted that two members being electrically connected means that the two members may be connected to each other via yet another member, or the two members may be connected directly to each other. A write current is applied between the terminal 13a and the terminal 13b. A read current is applied between the terminal 24 and one of the terminals 13a and 13b.

Although the MTJ element 20 is disposed on the conductive layer 12, the MTJ element 20 may be disposed below the conductive layer 12.

The nonmagnetic layer 12 and the nonmagnetic layer 21b are formed with a material that has an SOT effect, and are in such a relationship that the spin Hall angles $\Theta_{SH}$ indicating the respective SOT effects have signs opposite to each other. That is, in a case where the spin Hall angle $\Theta_{SH}$ of the nonmagnetic layer 12 is negative, the spin Hall angle $\Theta_{SH}$ of the nonmagnetic layer 21b is positive. In a case where the spin Hall angle $\Theta_{SH}$ of the nonmagnetic layer 12 is positive, the spin Hall angle $\Theta_{SH}$ of the nonmagnetic layer 21b is negative.

Figure 2:
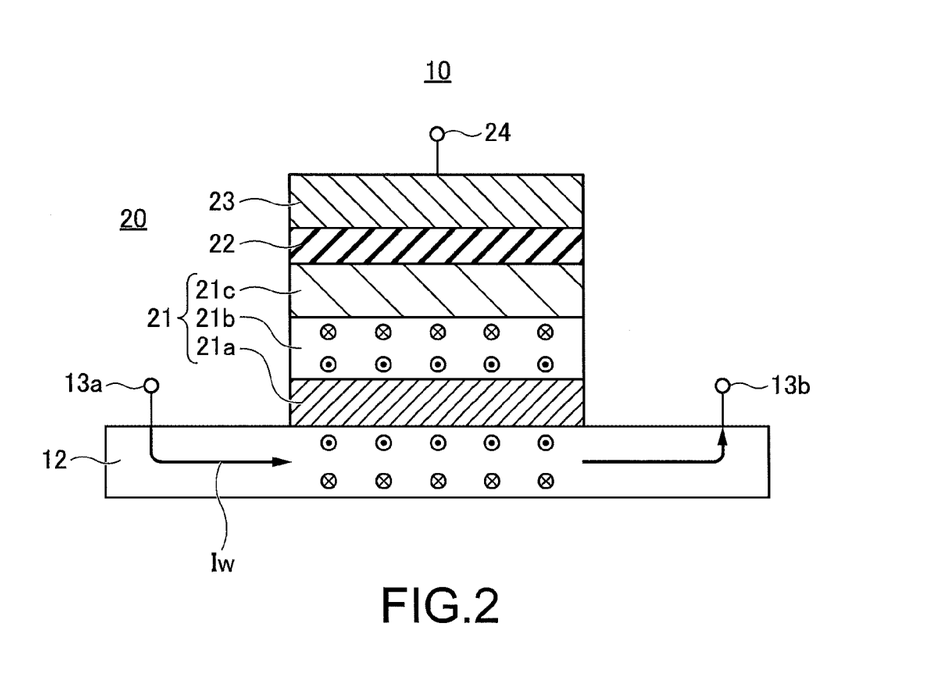
FIG. 2 is a diagram for explaining the effects of the magnetic memory of the first embodiment.

In this embodiment, the material of the nonmagnetic layer 21b preferably has a lower resistivity than the material of the nonmagnetic layer 12, and also preferably has a lower resistivity than the material of the magnetic layer 21a. With this structure, electric current can be applied to the nonmagnetic layer 21b, which is preferable for the following reasons. When the write current is applied to the nonmagnetic layer 12 in the direction from the terminal 13b toward the terminal 13a, a write electron current Iw flows in the nonmagnetic layer 12 from the terminal 13a toward the terminal 13b. As a result, spin-polarized electrons with up-spin, for example, flow in the surface of the nonmagnetic layer 12 on the side of the MTJ element 20 or in the upper surface of the nonmagnetic layer 12, and spin-polarized electrons with down-spin flow in the surface of the nonmagnetic layer 12 on the opposite side from the MTJ element 20 or in the lower surface of the nonmagnetic layer 12, as shown in FIG. 2. Consequently, a spin current from the lower surface toward the upper surface or from the upper surface toward the lower surface flows in the portion of the nonmagnetic layer 12 located immediately below the MTJ element 20. This spin current applies a spin torque to the magnetization of the magnetic layer 21a so that the magnetization direction of the magnetic layer 21a can be switched. In this embodiment, part of the write electron current Iw further flows into the nonmagnetic layer 21b via the magnetic layer 21a. Since the sign of the spin Hall angle of the nonmagnetic layer 21b and the sign of the spin Hall angle of the nonmagnetic layer 12 are opposite to each other, the part of the write electron current Iw flowing into the nonmagnetic layer 21b splits, so that the spin-polarized electrons with up-spin flow into the surface (lower surface) on the side of the magnetic layer 21a, and the spin-polarized electrons with down-spin flow into the surface (upper surface) on the side of the magnetic layer 21c. As a result, the magnetization of the magnetic layer 21a is subjected to a spin torque in the same direction from the nonmagnetic layer 12 and the nonmagnetic layer 21b. Thus, the magnetization of the magnetic layer 21a can be switched more easily than in a case where the storage layer 21 has a single-layer structure, instead of a stack structure. Although the spin direction is an in-plane direction (a direction perpendicular to the direction of stacking in the MTJ element 20) in FIG. 2, the spin direction may be a direction perpendicular to the plane (the direction of stacking in the MTJ element 20).

When the write current is applied, a voltage may be applied to the terminal 24 connected to the reference layer 23. As the voltage is applied, the uniaxial magnetic anisotropy of the magnetic layer 21a and the magnetic layer 21c serving as storage layers is changed so that the magnetization direction of the storage layer 21 can be switched more easily.

The nonmagnetic layer 12 and the nonmagnetic layer 21b each contain a metal element. A material containing W, Ta, Hf, Re, Cu—Bi, Ag—Bi, Pt—B, Cr—B, or V—B is used as the nonmagnetic material having a negative spin Hall angle $\Theta_{SH}$. Here, "A-B" means an alloy containing an element A and an element B.

Meanwhile, a material containing Pt, Pd, Pd—B, Pd—Bi, Ag—B, Au, Au—W, Cu—B, Cu—Ir, Ru—B, Ru—Bi, Rh—B, Rh—Bi, Ir, Ir—B, Ir—Bi, or Bi is used as the nonmagnetic material having a positive spin Hall angle $\Theta_{SH}$.

Further, the thickness of the nonmagnetic layer 21b is preferably 3 nm or smaller so as to achieve antiferromagnetic coupling between the magnetic layer 21a and the magnetic layer 21c.

The materials of the magnetic layer 21a, the magnetic layer 21c, and the reference layer 23 are not limited to any particular materials. Each of the magnetic layer 21a, the magnetic layer 21c, and the reference layer 23 is preferably a layer formed with at least one material selected from the group consisting of Fe, Co, Ni—Fe alloys, Co—Fe alloys, Co—Fe—Ni alloys, amorphous materials such as (Co, Fe)—(B), (Co, Fe, Ni)—(B), (Co, Fe, Ni)—(B)—(P, Al, Mo, Nb, Mn)-based alloys, and Co—(Zr, Hf, Nb, Ta, Ti)-based alloys, and Heusler materials such as Co—Cr—Fe—Al-based alloys, Co—Cr—Fe—Si-based alloys, Co—Mn—Si-based alloys, and Co—Mn—Al.

The nonmagnetic layer that is disposed between the storage layer 21 and the reference layer 23 and serves as a tunnel barrier is preferably formed with at least one material selected from the group consisting of MgO, AlN, Al$_2$O$_3$, SiN, SiOx, and HfOx, or an oxide or a nitride of at least one element selected from the group consisting of La, Ce, Pr, Nd, Pm, Sm, Eu, Gd, Tb, Dy, Ho, Er, Tm, and Yb. As used herein, a phrase referring to "at least one of" a list of items refers to any combination of those items, including a single member. As an example, "at least one of: a, b, or c" is intended to cover a, b, c, a-b, a-c, b-c, and a-b-c." The thickness of the nonmagnetic layer 22 is preferably 1 nm or smaller.

(First Modification)

Figure 3:
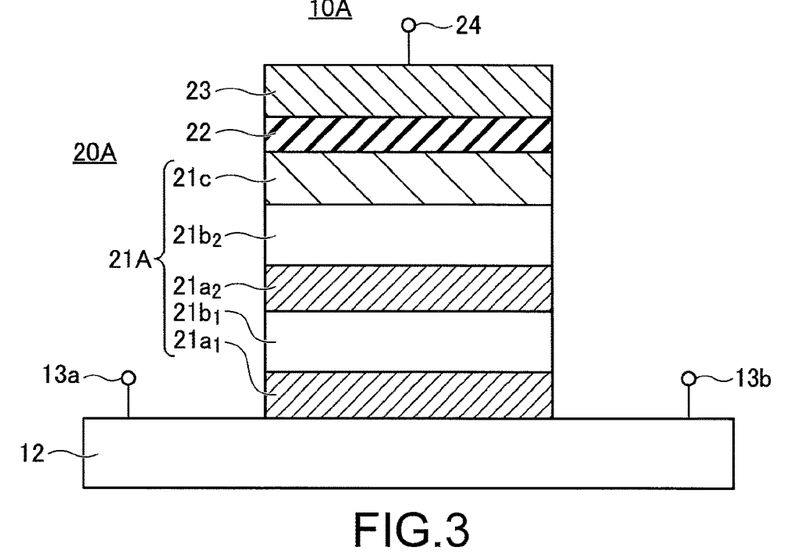
FIG. 3 is a cross-sectional view of a magnetic memory according to a first modification of the first embodiment.

FIG. 3 shows a cross-section of a memory cell 10A of a magnetic memory according to a first modification of the first embodiment. The magnetic memory of the first modification includes at least one memory cell 10A. Each memory cell 10A includes a nonmagnetic layer 12 and an MTJ element 20A disposed on the nonmagnetic layer 12. The MTJ element 20A has the same structure as the MTJ element 20 of the memory cell 10 of the first embodiment shown in FIG. 1, except that the storage layer 21 is replaced with a storage layer 21A. The storage layer 21A has the same structure as the storage layer 21 shown in FIG. 1, except that magnetic layers 21a and nonmagnetic layers 21b are repeatedly stacked, and a magnetic layer 21c is disposed as the uppermost layer. In the structure shown in FIG. 3, two magnetic layers 21a and two nonmagnetic layers 21b are alternately stacked. Specifically, a magnetic layer $21a_1$, a nonmagnetic layer $21b_1$, a magnetic layer $21a_2$, and a nonmagnetic layer $21b_2$ are stacked in this order on the nonmagnetic layer 12, and the magnetic layer 21c is stacked thereon as the uppermost layer. The magnetic layer $21a_1$ and the magnetic layer $21a_2$ are antiferromagnetically coupled to each other via the nonmagnetic layer $21b_1$, and the magnetic layer $21a_2$ and the magnetic layer 21c are antiferromagnetically coupled to each other via the nonmagnetic layer $21b_2$. As the storage layer 21A has such a structure, the thermal stability of the magnetization of the storage layer 21A is increased, and fluctuations of the magnetic memory can be reduced.

The first modification can achieve the same effects as those of the first embodiment.

(Second Modification)

Figure 4:
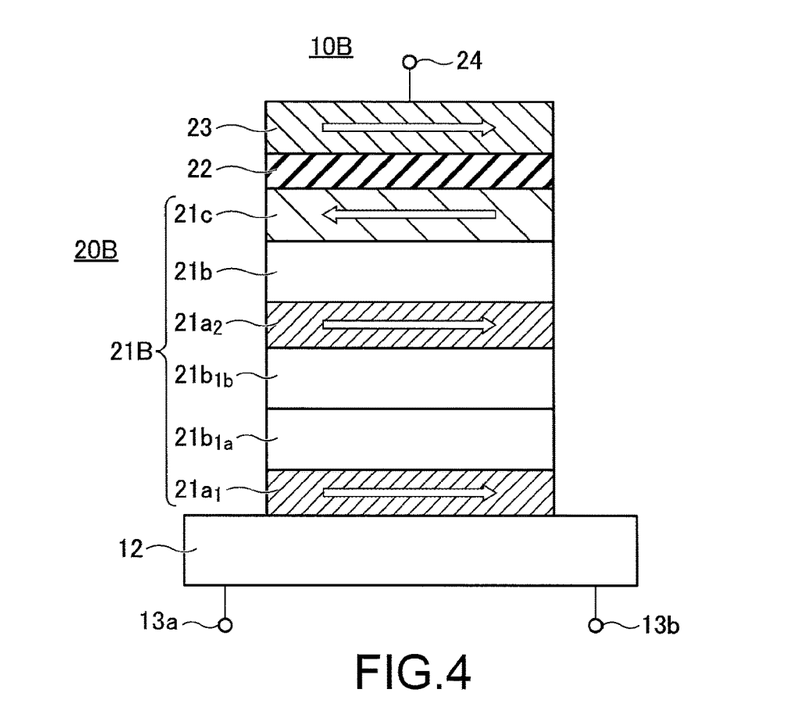
FIG. 4 is a cross-sectional view of a magnetic memory according to a second modification of the first embodiment.

FIG. 4 shows a cross-section of a memory cell 10B of a magnetic memory according to a second modification of the first embodiment. The magnetic memory of the second modification includes at least one memory cell 10B. Each memory cell 10B includes a nonmagnetic layer 12 and an MTJ element 20B disposed on the nonmagnetic layer 12. The MTJ element 20B has the same structure as the MTJ element 20 of the memory cell 10 of the first embodiment shown in FIG. 1, except that the magnetic layer 21a is replaced with a stack structure in which a magnetic layer $21a_1$, a nonmagnetic layer $21b_{1a}$, a nonmagnetic layer $21b_{1b}$, and a magnetic layer $21a_2$ are stacked in this order on the nonmagnetic layer 12. The magnetic layer $21a_1$ and the magnetic layer $21a_2$ are ferromagnetically coupled to each other via the nonmagnetic layer $21b_{1a}$ and the nonmagnetic layer $21b_{1b}$, and the magnetic layer $21a_2$ and the magnetic layer 21c are antiferromagnetically coupled to each other via the nonmagnetic layer 21b. The sign of the spin Hall angle of the nonmagnetic layer $21b_{1a}$ is opposite to the sign of the spin Hall angle of the nonmagnetic layer 12, and the sign of the spin Hall angle of the nonmagnetic layer $21b_{1b}$ is opposite to the sign of the spin Hall angle of the nonmagnetic layer $21b_{1a}$.

As the storage layer 21B has such a structure, the thermal stability of the magnetization of the storage layer 21B is increased, and fluctuations of the magnetic memory can be reduced. Furthermore, the current for switching the magnetization direction of the magnetic layer $21a_1$ can be made even smaller. Alternatively, the storage layer 21B may include repeatedly stack structures each consisting of a magnetic layer $21a_1$, a nonmagnetic layer $21b_{1a}$, a nonmagnetic layer $21b_{1b}$, and a magnetic layer $21a_2$.

The second modification can also achieve the same effects as those of the first embodiment.

As described above, the first embodiment and the modifications thereof provide a magnetic memory that can facilitate a magnetization switching in a storage layer, and reduce the influence of electric field leakage.

(Second Embodiment)

Figure 5:
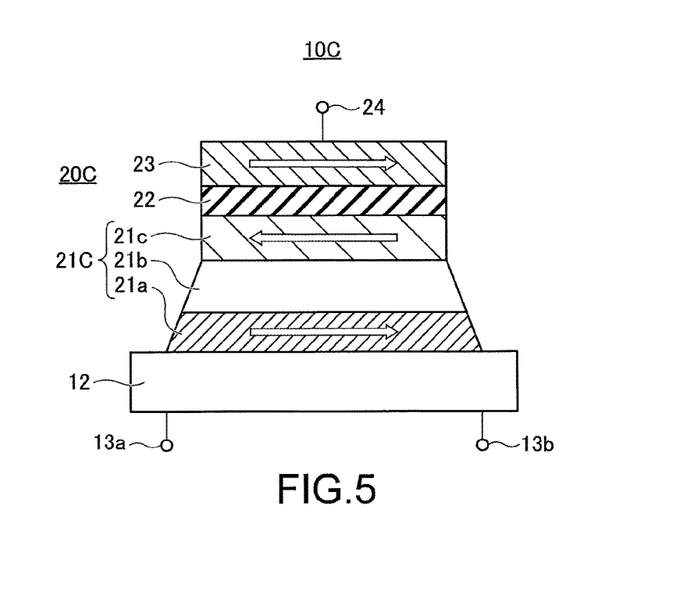
FIG. 5 is a cross-sectional view of a magnetic memory according to a second embodiment.

FIG. 5 shows a cross-section of a memory cell 10C of a magnetic memory according to a second embodiment. The memory cell 10C of the second embodiment is the same as the memory cell 10 of the first embodiment shown in FIG. 1, except that the MTJ element 20 is replaced with an MTJ element 20C. The MTJ element 20C is the same as the MTJ element 20 shown in FIG. 1, except that the storage layer 21 is replaced with a storage layer 21C. The storage layer 21C has a tapered shape, with a magnetic layer 21a and a nonmagnetic layer 21b widening in the direction toward the nonmagnetic layer 12. With this structure, the vertical component of the write current can be reduced. Thus, an SOT effect can be more readily achieved, and a magnetization switching in the storage layer can be more easily caused.

Figure 6:
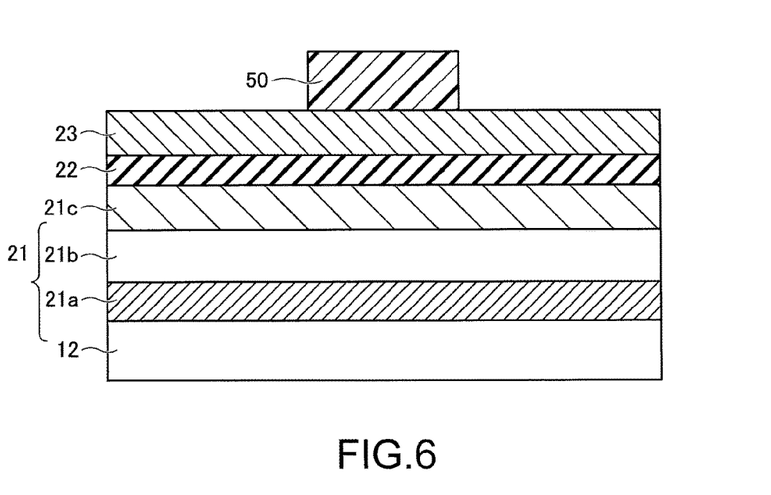
FIG. 6 is a cross-sectional view for explaining a method of manufacturing the magnetic memory of the second embodiment.

Referring now to FIG. 6, a method of manufacturing the magnetic memory of the second embodiment is described.

First, the nonmagnetic layer 12, the magnetic layer 21a, the nonmagnetic layer 21b, the magnetic layer 21c, the nonmagnetic layer 22, and the magnetic layer 23 are sequentially formed. A resist is then applied onto the magnetic layer 23, and patterning is performed by a photolithography technique, to form a resist pattern 50 (FIG. 6). The patterning method is not limited to this.

After the patterning, the magnetic layer 23, the nonmagnetic layer 22, and the magnetic layer 21c are processed by a technique such as ion milling. At this stage, the ion incidence angle is set at approximately 0 degrees with respect to the vertical line of the upper surface of the resist pattern 50.

After that, the ion incidence angle is greatly changed, and ion milling is performed from a diagonal direction, to process the nonmagnetic layer 21b and the magnetic layer 21a. As a result, the side surfaces of the nonmagnetic layer 21b and the magnetic layer 21a can be tilted.

Like the first embodiment, the second embodiment provides a magnetic memory that can facilitate a magnetization switching in a storage layer, and reduce the influence of electric field leakage.

(Third Embodiment)

Figure 7:
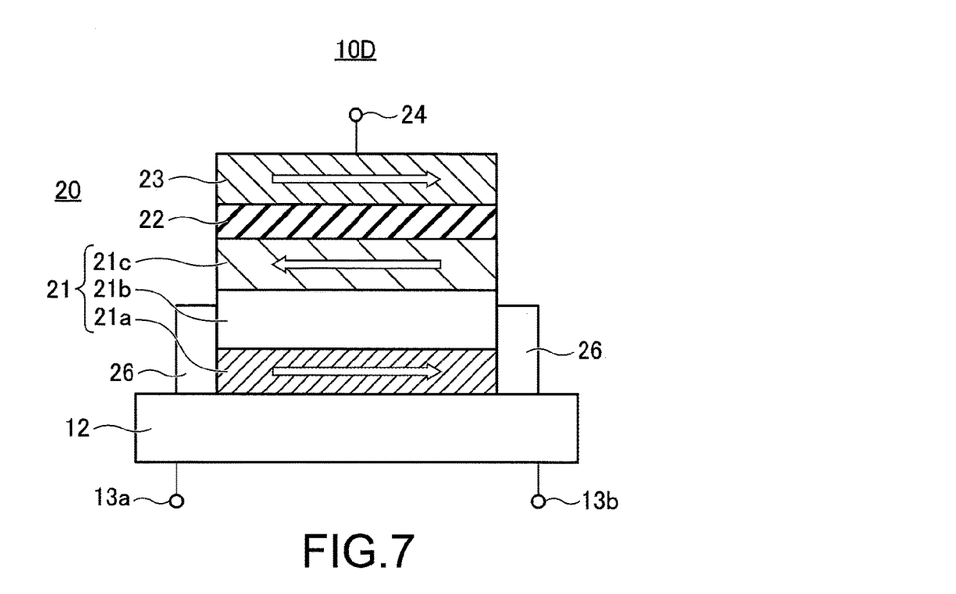
FIG. 7 is a cross-sectional view of a magnetic memory according to a third embodiment.

FIG. 7 shows a cross-section of a memory cell 10D of a magnetic memory according to a third embodiment. The memory cell 10D of the third embodiment is the same as the memory cell 10 of the first embodiment shown in FIG. 1, except that a layer 26 containing the same element as that in the nonmagnetic layer 12 is provided at side portions of the magnetic layer 21a and the nonmagnetic layer 21b. The layer 26 is a layer that adheres to the nonmagnetic layer 12 when the nonmagnetic layer 12 is processed, for example, and normally contains the same element as that in the nonmagnetic layer 12, or an oxide or a nitride of the same element. The height of the layer 26 from the nonmagnetic layer 12 may be smaller than the sum of the thicknesses of the magnetic layer 21a and the nonmagnetic layer 21b.

With this structure, the vertical component of the write current can be reduced. Thus, an SOT effect can be more readily achieved, and a magnetization switching in the storage layer can be more easily caused.

Like the first embodiment, the third embodiment also provides a magnetic memory that can facilitate a magnetization switching in a storage layer, and reduce the influence of electric field leakage.

(Fourth Embodiment)

Figure 8:
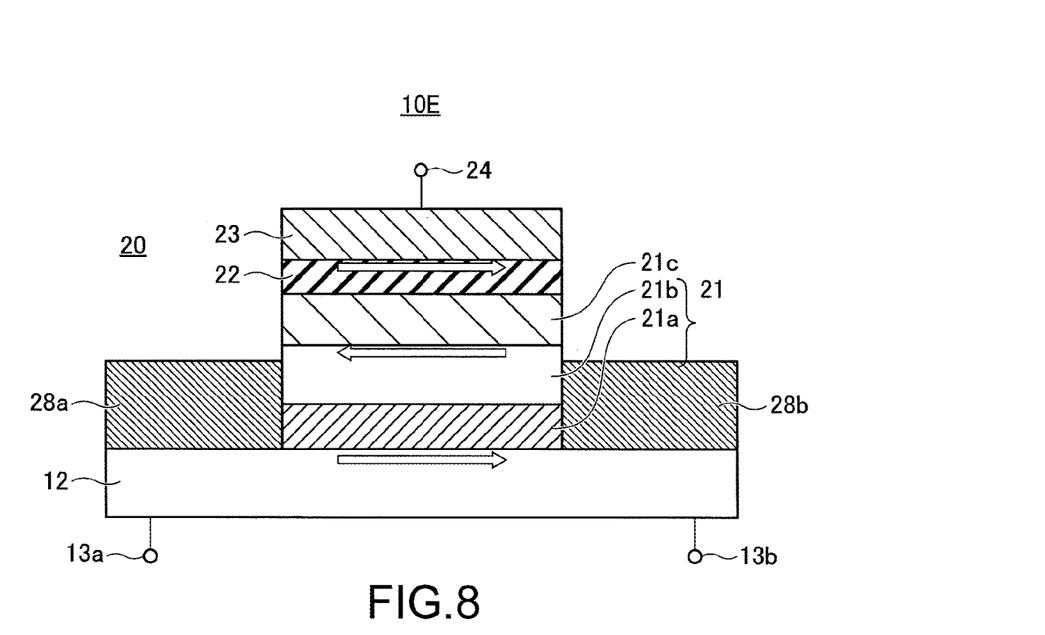
FIG. 8 is a cross-sectional view of a magnetic memory according to a fourth embodiment.

FIG. 8 shows a cross-section of a memory cell 10E of a magnetic memory according to a fourth embodiment. The memory cell 10E of the fourth embodiment is the same as the memory cell 10 of the first embodiment shown in FIG. 1, except for further including a pair of electrodes 28a and 28b disposed at side portions of the magnetic layer 21a and the nonmagnetic layer 21b. These electrodes 28a and 28b are formed with a material having a lower resistance than the nonmagnetic layer 21b. With this structure, the vertical component of the write current can be reduced, and a larger amount of write current can be applied to the nonmagnetic layer 21b. Thus, an SOT effect can be more readily achieved, and a magnetization switching in the storage layer can be more easily caused. Furthermore, the wiring resistance in the path in which the write current flows, or particularly the wiring resistance of the nonmagnetic layer 12, can be lowered, and an effect to reduce power consumption can also be achieved. It should be noted that the height of the electrodes 28a and 28b from the nonmagnetic layer 12 may be smaller than the sum of the thicknesses of the magnetic layer 21a and the nonmagnetic layer 21b.

Like the first embodiment, the fourth embodiment also provides a magnetic memory that can facilitate a magnetization switching in a storage layer, and reduce the influence of electric field leakage.

(Fifth Embodiment)

Figure 9:
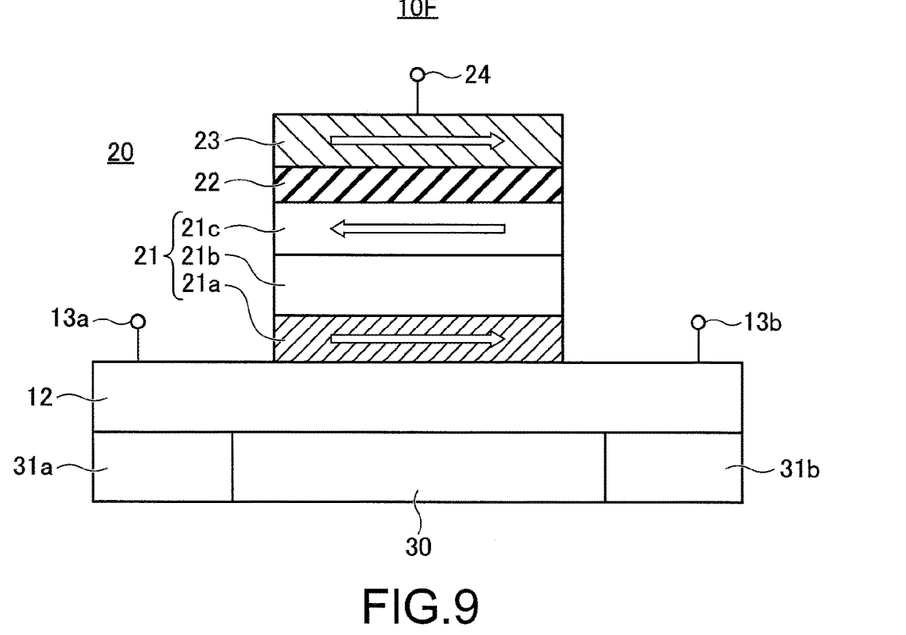
FIG. 9 is a cross-sectional view of a magnetic memory according to a fifth embodiment.

FIG. 9 shows a cross-section of a memory cell 10F of a magnetic memory according to a fifth embodiment. The memory cell 10F of the fifth embodiment is the same as the memory cell 10 of the first embodiment shown in FIG. 1, except that a silicon nanowire 30 is formed under the nonmagnetic layer 12, and regions 31a and 31b of the silicon nanowire 30 outside the region located immediately below the MTJ element 20 are doped with an impurity.

With this structure, the wiring resistance in the path in which the write current flows, or particularly the wiring resistance of the nonmagnetic layer 12, can be lowered, and an effect to reduce power consumption can also be achieved.

Like the first embodiment, the fifth embodiment also provides a magnetic memory that can facilitate a magnetization switching in a storage layer, and reduce the influence of electric field leakage.

A magnetic memory may be formed by appropriately combining two or more of the structures described in the above embodiments and the modifications thereof.

EXAMPLES

Embodiments of the present invention will be described below in greater detail, with reference to Examples.

Example 1

Figure 10:
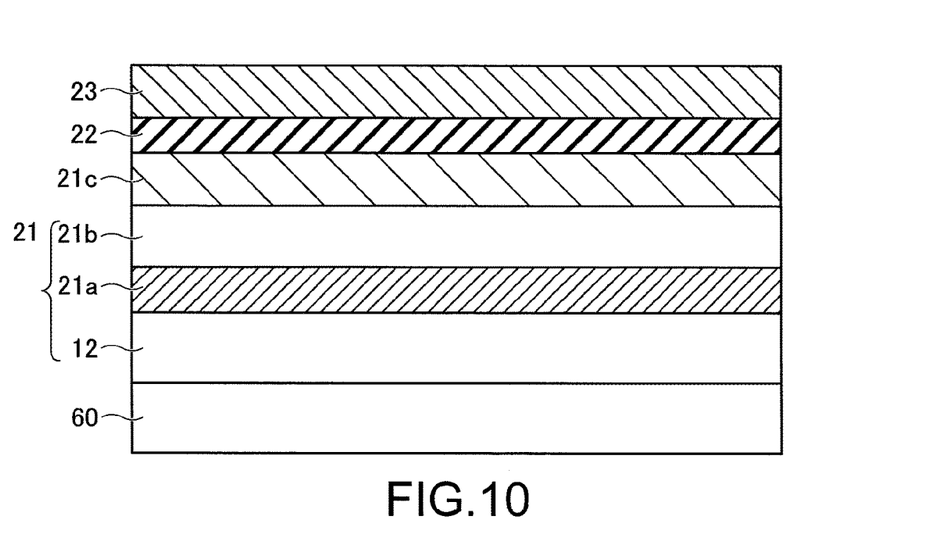
FIG. 10 is a diagram showing a procedure for manufacturing a magnetic memory of Example 1.
Figure 11:
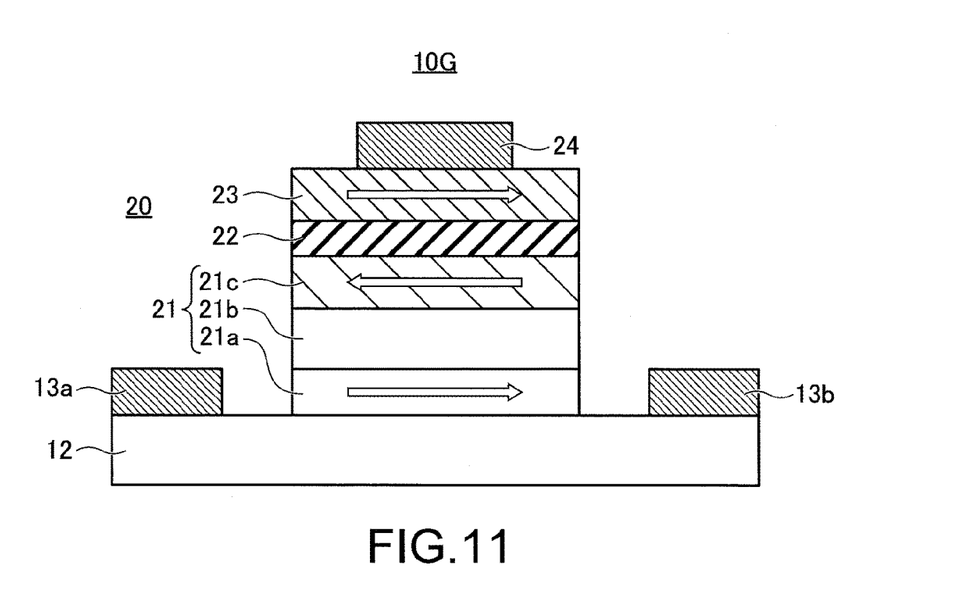
FIG. 11 is a diagram showing another procedure for manufacturing the magnetic memory of Example 1.
Figure 12:
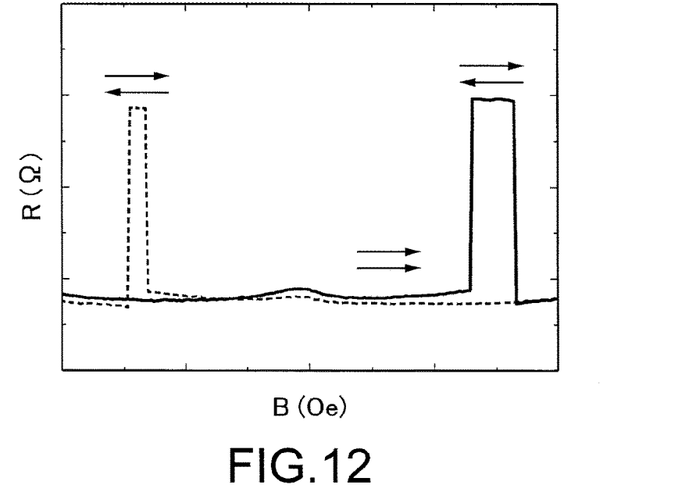
FIG. 12 is a graph showing the magnetic characteristics of first and second devices in Example 1.

Referring now to FIGS. 10 through 12, Example 1 is described. In Example 1, a 10-nm thick Pt layer is formed as the nonmagnetic layer 12 on a Si substrate 60, a 1-nm thick CoFe layer is formed as the magnetic layer 21a, a 2-nm thick Pt layer is formed as the nonmagnetic layer 21b, a 1-nm thick Fe layer is formed as the magnetic layer 21c, a 1-nm thick MgO layer is formed as the nonmagnetic layer 22, and a 5-nm thick Fe layer is formed as the magnetic layer 23 serving as the reference layer. In this manner, a first sample is prepared. Further, a second sample is prepared. The second sample is the same as the first sample, except that a 2-nm thick W layer, instead of the 2-nm thick Pt layer, is used as the nonmagnetic layer 21b. An ultrahigh vacuum sputtering system is used in manufacturing the first and second samples.

A resist is then applied onto the magnetic layer 23 of each of the first and second samples, and patterning is performed, to form a resist pattern in the shape of an MTJ element. With this resist pattern serving as a mask, patterning is performed on the magnetic layer 23, the nonmagnetic layer 22, the magnetic layer 21c, the nonmagnetic layer 21b, and the magnetic layer 21a, and the other portions are removed by a milling technique.

A resist is then applied again, and patterning is performed on the resist, to form a resist pattern (not shown). A metal is deposited on this resist pattern, and a liftoff process is performed, to form electrodes (terminals) 13a and 13b on the nonmagnetic layer 12, and an electrode (terminal) 24 on the reference layer 23. Thus, each device is completed (FIG. 11). Of the manufactured devices, the one having a Pt layer as the nonmagnetic layer 21b is a first device, and the one having a W layer as the nonmagnetic layer 21b is a second device.

FIG. 12 shows the results of measurement of the magnetoresistive (MR) characteristics of the first device. The abscissa axis indicates the magnetic flux density B (Oe) of an external magnetic field, and the ordinate axis indicates resistance R (Ω). The solid line indicates the characteristics in a case where the external magnetic field is changed from a negative direction to a positive direction, and the dashed line indicates the characteristics in a case where the external magnetic field is changed from a positive direction to a negative direction. In the regions where the resistance R is high, the magnetization is in an antiparallel state. As can be seen from FIG. 12, the first device exhibits parallel and antiparallel states for an external magnetic field, and thus, functions as a memory.

Figure 13:
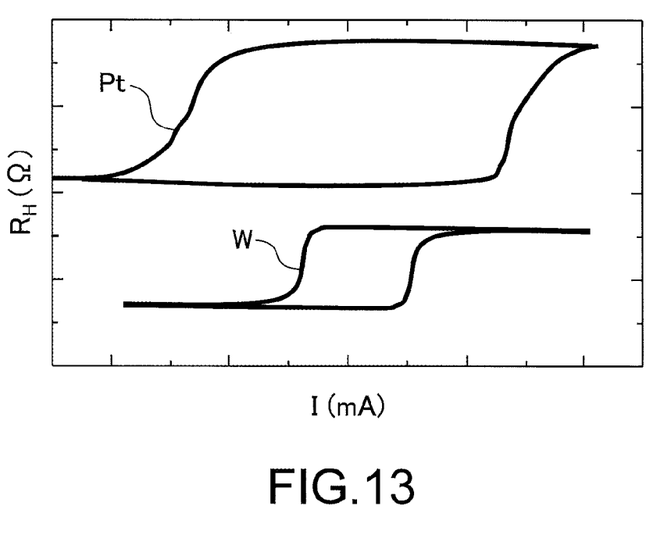
FIG. 13 is a graph showing the results of evaluation on hysteresis switching groups of the first and second devices.

Next, the hysteresis switching groups of the first and second devices were evaluated. FIG. 13 shows the results of the evaluation. As can be seen from FIG. 13, the switching current (reversing current) in the second device is lower than that in the first device. This indicates that the reversing current was reduced because a nonmagnetic material (W in this case) having a spin Hall angle with a sign opposite to that of the spin Hall angle of the nonmagnetic layer 12 was used as the nonmagnetic layer 21B.

Example 2

Figure 14:
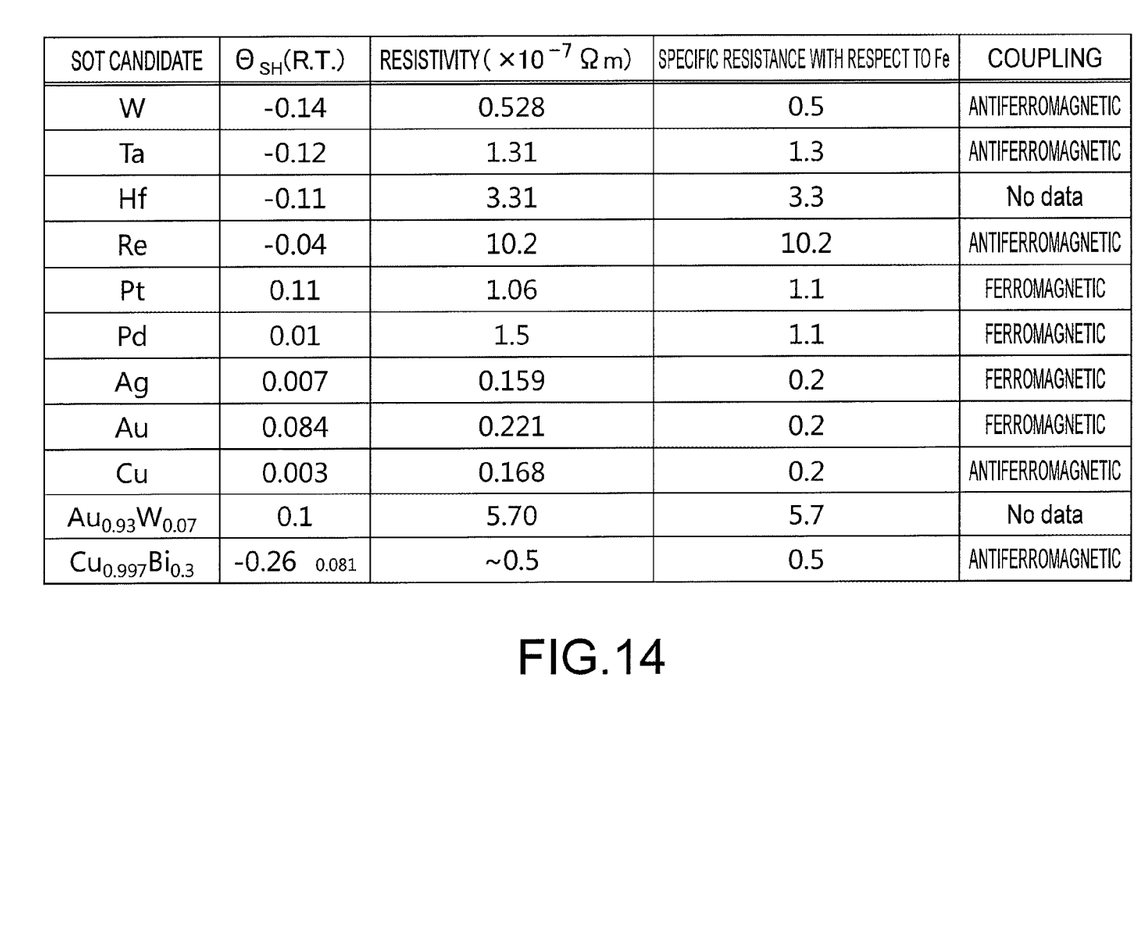
FIG. 14 is a table showing the spin Hall angles $\Theta_{SH}$, the resistivities, and the types of ferromagnetic coupling of candidate materials for a nonmagnetic layer in Example 2.

The results of examinations conducted on candidate materials for the nonmagnetic layer 12 and the nonmagnetic layer 21b as Example 2 are shown in FIG. 14. FIG. 14 shows the spin Hall angles $\Theta_{SH}$, the resistivities, and the types of ferromagnetic coupling of the respective candidate materials. FIG. 14 also shows the specific resistance relationship in a case where an Fe layer is used as the magnetic layer 21a.

To obtain the magnetic memory of the first embodiment shown in FIG. 1, the use of W, Ta, Re, Cu, or Cu—Bi, which is to be antiferromagnetically coupled as the nonmagnetic layer 21b, is expected, and the other materials are expected as candidate materials for the nonmagnetic layer 12. However, a material that is to be antiferromagnetically coupled to the nonmagnetic layer 12 may be used.

From the viewpoint of resistivity, W, Ag, Au, Cu, or Cu—Bi, which has a low resistivity, is preferably used as the nonmagnetic layer 21b. However, such a material is not necessarily used as the nonmagnetic layer 21b in a case where a high-resistivity material such as Re is used as the nonmagnetic layer 12. As can be seen from the above results, the magnetic memory of the first embodiment shown in FIG. 1 can be obtained where W, Cu, or Cu—Bi, which is a material that is to be antiferromagnetically coupled and has a low resistivity, is used as the nonmagnetic layer 21b.

(Sixth Embodiment)

Figure 15:
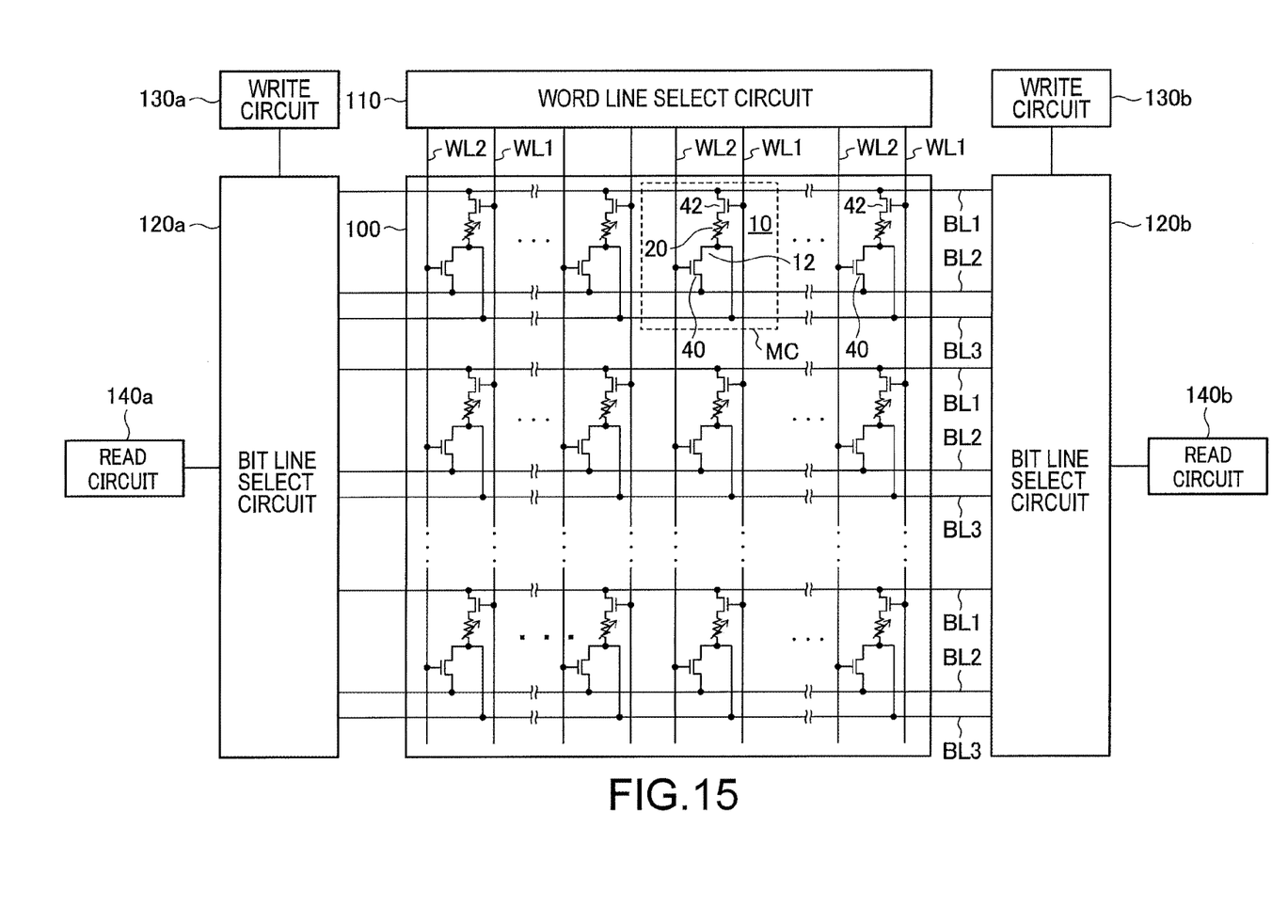
FIG. 15 is a circuit diagram showing a magnetic memory according to a sixth embodiment.

Referring now to FIG. 15, a magnetic memory according to a sixth embodiment is described. FIG. 15 is a circuit diagram of the magnetic memory of the sixth embodiment. The magnetic memory of the sixth embodiment includes a memory cell array 100 in which memory cells MC are arranged to form an array, two word lines WL1 and WL2 provided for the memory cells MC arranged in the same column, three bit lines BL1, BL2, and BL3 provided for the memory cells MC arranged in the same row, a word line select circuit 110, bit line select circuits 120a and 120b, write circuits 130a and 130b, and read circuits 140a and 140b.

Each memory cell MC is the memory cell 10 of the magnetic memory of the first embodiment shown in FIG. 1, and includes transistors 40 and 42. Each memory cell MC includes a nonmagnetic layer 12 and a magnetoresistive element (MTJ element) 20, as shown in FIG. 1.

One end of the magnetoresistive element 20 is connected to the conductive layer 12, and the other end is connected to one of the source and the drain of the transistor 42. The other one of the source and the drain of the transistor 42 is connected to the bit line BL1, and the gate of the transistor 42 is connected to the word line WL1. A first terminal (the terminal 13a in FIG. 1) of the conductive layer 12 is connected to one of the source and the drain of the transistor 40, and a second terminal (the terminal 13b in FIG. 1) is connected to the bit line BL3. The other one of the source and the drain of the transistor 40 is connected to the bit line BL2, and the gate of the transistor 40 is connected to the word line WL2.

(Write Operation)

Next, writing on a memory cell is described. First, the word line select circuit 110 applies a high-level potential to the word line WL2 to which the gate of the transistor 40 of the memory cell MC on which the writing is to be performed is connected. In this manner, the transistor 40 of the memory cell MC on which writing is to be performed is put into an on-state. At this stage, the transistors 40 of the other memory cells MC in the column to which the target memory cell MC belongs are also put into an on-state. However, a low-level potential is applied to the word line WL1 connected to the gate of the transistor 40 in the target memory cell MC and the word lines WL1 and WL2 corresponding to the other columns.

The bit lines BL2 and BL3 connected to the memory cell MC on which writing is to be performed are then selected by the bit line select circuits 120a and 120b. The write circuits 130a and 130b then apply the write current to the selected bit lines BL2 and BL3 in the direction from one of the bit line select circuits 120a and 120b toward the other one of the bit line select circuits 120a and 120b. With this write current, the magnetization direction of the storage layer 21 (see FIG. 1) of the magnetoresistive element 20 becomes switched, and writing is performed. If the write current is applied in the direction from the other one of the bit line select circuits 120a and 120b toward the one of the bit line select circuits 120a and 120b, the magnetization direction of the storage layer 21 (see FIG. 1) of the magnetoresistive element 20 becomes switched in the opposite direction from that in the above described case, and writing is then performed.

(Read Operation)

Next, an operation to read from a memory cell is described. First, a high-level potential is applied to the word line WL1 connected to the memory cell MC on which reading is to be performed, so that the transistor 42 in the target memory cell MC is put into an on-state. At this stage, the transistors 42 of the other memory cells MC in the column to which the target memory cell MC belongs are also put into an on-state. However, a low-level potential is applied to the word line WL2 connected to the gate of the transistor 40 in the target memory cell MC, and the word lines WL1 and WL2 corresponding to the other columns.

The bit lines BL1 and BL3 connected to the memory cell MC on which reading is to be performed are selected by the bit line select circuits 120a and 120b. The read circuits 140a and 140b then apply the read current to the selected bit lines BL1 and BL3 in the direction from one of the bit line select circuits 120a and 120b toward the other one of the bit line select circuits 120a and 120b. At this stage, the voltage between the selected bit lines BL1 and BL3 is detected by the read circuits 140a and 140b, for example, so that a check can be made to determine whether the magnetization directions of the storage layer 21 (see FIG. 1) and the reference layer 23 of the magnetoresistive element 20 are in a parallel state (in the same direction) or whether the magnetization directions of the storage layer 21 and the reference layer 23 are in an antiparallel state (in the opposite directions). That is, reading can be performed.

Like the first embodiment, the sixth embodiment also provides a magnetic memory that can facilitate a magnetization switching in a storage layer, and reduce the influence of electric field leakage. Although the memory cells 10 of the magnetic memory of the first embodiment are used as the memory cells MC in the sixth embodiment, it is also possible to use the memory cells of a magnetic memory according to any of the modifications of the first embodiment and the second through fifth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first terminal;
a second terminal;
a third terminal;
a conductive layer including first through third portions, the conductive layer being nonmagnetic, the first portion being located between the second portion and the third portion, the second portion being electrically connected to the first terminal, the third portion being electrically connected to the second terminal; and
a magnetoresistive element including:
  a first magnetic layer electrically connected to the third terminal;
  a second magnetic layer disposed between the first magnetic layer and the first portion;
  a first nonmagnetic layer disposed between the first magnetic layer and the second magnetic layer;
  a third magnetic layer disposed between the first nonmagnetic layer and the second magnetic layer; and
  a second nonmagnetic layer disposed between the second magnetic layer and the third magnetic layer, wherein
a sign of a spin Hall angle of the second nonmagnetic layer is different from a sign of a spin Hall angle of the conductive layer,
the first terminal and the second terminal are arranged in line with a first direction, and
a length of the second magnetic layer in the first direction is longer than a length of the first magnetic layer in the first direction.

2. The memory according to claim 1, wherein
a material of the conductive layer contains one of W, Ta, Hf, Re, Cu—Bi, Ag—Bi, Pt—B, Cr—B, or V—B, and
a material of the second nonmagnetic layer differs from the material of the conductive layer and contains one of Pt, Pd, Pd—B, Pd—Bi, Ag, Ag—B, Au, Au—W, Cu, Cu—B, Cu—Ir, Ru—B, Ru—Bi, Rh—B, Rh—Bi, Ir, Ir—B, Ir—Bi, or Bi.

3. The memory according to claim 1, wherein
a material of the conductive layer contains one of Pt, Pd, Pd—B, Pd—Bi, Ag, Ag—B, Au, Au—W, Cu, Cu—B, Cu—Ir, Ru—B, Ru—Bi, Rh—B, Rh—Bi, Ir, Ir—B, Ir—Bi, or Bi, and
a material of the second nonmagnetic layer differs from the material of the conductive layer and contains one of W, Ta, Hf, Re, Cu—Bi, Ag—Bi, Pt—B, Cr—B, or V—B.

4. The memory according to claim 1, wherein a resistivity of the second nonmagnetic layer is lower than a resistivity of each of the conductive layer and the second magnetic layer.

5. The memory according to claim 1, wherein
the second nonmagnetic layer includes a first face on a side of the second magnetic layer, a second face on a side of the third magnetic layer, and a third face crossing the first face and the second face,
the third face crosses the first direction,
the second magnetic layer includes a fourth face facing the first face, a fifth face on a side of the conductive layer, and a sixth face crossing the fourth face and the fifth face,
the sixth face crosses the first direction, and
a first layer containing the same element as an element contained in the conductive layer is disposed on the third face and the sixth face.

6. The memory according to claim 1, wherein
the second nonmagnetic layer includes a first face on a side of the second magnetic layer, a second face on a side of the third magnetic layer, and a third face crossing the first and the second face,
the third face crosses the first direction,
the second magnetic layer includes a fourth face facing the first face, a fifth face on a side of the conductive layer, and a sixth face crossing the face and the fifth face,
the sixth face crosses the first direction, and
a layer having a lower resistance than the second nonmagnetic layer is disposed on the third face and the sixth face.

7. The memory according to claim 1, further comprising:
a first circuit configured to apply a write current between the first terminal and the second terminal; and
a second circuit configured to apply a read current between the third terminal and the first terminal.

8. The memory according to claim 7, wherein, when applying the write current between the first terminal and the second terminal, the first circuit applies a voltage to the third terminal.

9. A magnetic memory comprising:
a first terminal;
a second terminal;
a third terminal;
a conductive layer including first through third portions, the conductive layer being nonmagnetic, the first portion being located between the second portion and the third portion, the second portion being electrically connected to the first terminal, the third portion being electrically connected to the second terminal; and
a magnetoresistive element including:
  a first magnetic layer electrically connected to the third terminal;

a second magnetic layer disposed between the first magnetic layer and the first portion;
a first nonmagnetic layer disposed between the first magnetic layer and the second magnetic layer;
a third magnetic layer disposed between the first nonmagnetic layer and the second magnetic layer; and
a second nonmagnetic layer disposed between the second magnetic layer and the third magnetic layer, wherein
a material of the conductive layer contains one of W, Ta, Hf, Re, Cu—Bi, Ag—Bi, Pt—B, Cr—B, or V—B,
a material of the second nonmagnetic layer differs from the material of the conductive layer and contains one of Pt, Pd, Pd—B, Pd—Bi, Ag, Ag—B, Au, Au—W, Cu Cu—B, Cu—Ir, Ru—B, Ru—Bi, Rh—B, Rh—Bi, Ir, Ir—B, Ir—Bi, or Bi,
the first terminal and the second terminal are arranged in line with a first direction, and
a length of the second magnetic layer in the first direction is longer than a length of the first magnetic layer in the first direction.

10. The memory according to claim 9, wherein a resistivity of the second nonmagnetic layer is lower than a resistivity of each of the conductive layer and the second magnetic layer.

11. The memory according to claim 9, wherein
the second nonmagnetic layer includes a first face on a side of the second magnetic layer, a second face on a side of the third magnetic layer, and a third face crossing the first face and the second face,
the third face crosses the first direction,
the second magnetic layer includes a fourth face facing the first face, a fifth face on a side of the conductive layer, and a sixth face crossing the fourth face and the fifth face,
the sixth face crosses the first direction, and
a first layer containing the same element as an element contained in the conductive layer is disposed on the third face and the sixth face.

12. The memory according to claim 9, wherein
the second nonmagnetic layer includes a first face on a side of the second magnetic layer, a second face on a side of the third magnetic layer, and a third face crossing the first face and the second face,
the third face crossed the first direction,
the second magnetic layer includes a fourth face facing the first face, a fifth face on a side of the conductive layer, and a sixth face crossing the fourth face and the fifth face,
the sixth face crosses the first direction, and
a layer having a lower resistance than the second nonmagnetic layer is disposed on the third face and the sixth face.

13. The memory according to claim 9, further comprising:
a first circuit configured to apply a write current between the first terminal and the second terminal; and
a second circuit configured to apply a read current between the third terminal and the first terminal.

14. The memory according to claim 13, wherein, when applying the write current between the first terminal and the second terminal, the first circuit applies a voltage to the third terminal.

15. A magnetic memory comprising:
a first terminal;
a second terminal;
a third terminal;
a conductive layer including first through third portions, the conductive layer being nonmagnetic, the first portion being located between the second portion and the third portion, the second portion being electrically connected to the first terminal, the third portion being electrically connected to the second terminal; and
a magnetoresistive element including:
a first magnetic layer electrically connected to the third terminal;
a second magnetic layer disposed between the first magnetic layer and the first portion;
a first nonmagnetic layer disposed between the first magnetic layer and the second magnetic layer;
a third magnetic layer disposed between the first nonmagnetic layer and the second magnetic layer; and
a second nonmagnetic layer disposed between the second magnetic layer and the third magnetic layer, wherein
a material of the conductive layer contains one of Pt, Pd, Pd—B, Pd—Bi, Ag, Ag—B, Au, Au—W, Cu Cu—B, Cu—Ir, Ru—B, Ru—Bi, Rh—B, Rh—Bi, Ir, Ir—B, Ir—Bi, or Bi,
a material of the second nonmagnetic layer differs from the material of the conductive layer and contains one of W, Ta, Hf, Re, Cu—Bi, Ag—Bi, Pt—B, Cr—B, or V—B,
the first terminal and the second terminal are arranged in line with a first direction, and
a length of the second magnetic layer in the first direction is longer than a length of the first magnetic layer in the first direction.

16. The memory according to claim 15, wherein a resistivity of the second nonmagnetic layer is lower than a resistivity of each of the conductive layer and the second magnetic layer.

17. The memory according to claim 15, wherein
the second nonmagnetic layer includes a first face on a side of the second magnetic layer, a second face on a side of the third magnetic layer, and a third face crossing the first face and the second face,
the third face crosses the first direction,
the second magnetic layer includes a fourth face facing the first face, a fifth face on a side of the conductive layer, and a sixth face crossing the fourth face and the fifth face,
the sixth face crosses the first direction, and
a first layer containing the same element as an element contained in the conductive layer is disposed on the third face and the sixth face.

18. The memory according to claim 15, wherein
the second nonmagnetic layer includes a first face on a side of the second magnetic layer, a second face on a side of the third magnetic layer, and a third face crossing the first face and the second face,
the third face crosses the first direction,
the second magnetic layer includes a fourth face facing the first face, a fifth face on a side of the conductive layer, and a sixth face crossing the fourth face and the fifth face,
the sixth face crosses the first direction, and
a layer having a lower resistance than the second nonmagnetic layer is disposed on the third face and the sixth face.

19. The memory according to claim 15, further comprising:
a first circuit configured to apply a write current between the first terminal and the second terminal; and a second circuit configured to apply a read current between the third terminal and the first terminal.

20. The memory according to claim 19, wherein, when applying the write current between the first terminal and the second terminal, the first circuit applies a voltage to the third terminal.

\* \* \* \* \*